United States Patent
Kakita et al.

(10) Patent No.: US 10,396,757 B2
(45) Date of Patent: Aug. 27, 2019

(54) ACOUSTIC WAVE DEVICE

(71) Applicant: TAIYO YUDEN CO., LTD., Tokyo (JP)

(72) Inventors: Naoki Kakita, Tokyo (JP); Takuma Kuroyanagi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/454,951

(22) Filed: Mar. 9, 2017

(65) Prior Publication Data

US 2017/0294895 A1    Oct. 12, 2017

(30) Foreign Application Priority Data

Apr. 6, 2016 (JP) .................. 2016-076882

(51) Int. Cl.
| | |
|---|---|
| H03H 9/00 | (2006.01) |
| H03H 9/145 | (2006.01) |
| H03H 9/64 | (2006.01) |
| H01L 23/522 | (2006.01) |
| H01L 23/528 | (2006.01) |
| H01L 23/532 | (2006.01) |
| H03H 9/05 | (2006.01) |
| H03H 9/72 | (2006.01) |

(52) U.S. Cl.
CPC ............ *H03H 9/64* (2013.01); *H01L 23/528* (2013.01); *H01L 23/5226* (2013.01); *H01L 23/53214* (2013.01); *H01L 23/53228* (2013.01); *H01L 23/53242* (2013.01); *H03H 9/0576* (2013.01); *H03H 9/14544* (2013.01); *H01L 2224/16225* (2013.01)

(58) Field of Classification Search
CPC ............ H03H 9/54; H03H 9/64; H03H 9/725
USPC .................................. 333/133, 193, 195
See application file for complete search history.

(56) References Cited

U.S. PATENT DOCUMENTS

| | | | | |
|---|---|---|---|---|
| 7,378,922 B2 * | 5/2008 | Kubo | .................. | B81C 1/00238 333/133 |
| 7,629,866 B2 * | 12/2009 | Kadota | ..................... | H03H 3/08 333/133 |
| 7,737,603 B2 * | 6/2010 | Kando | ................. | H03H 9/0222 310/313 A |
| 8,242,861 B2 * | 8/2012 | Yata | ..................... | H03H 9/6483 333/193 |
| 8,294,535 B2 * | 10/2012 | Feiertag | ................. | H03H 9/059 333/187 |

(Continued)

FOREIGN PATENT DOCUMENTS

| | | |
|---|---|---|
| JP | 11-136081 A | 5/1995 |
| JP | 2008-546207 A | 12/2008 |
| JP | 4375399 B2 | 12/2009 |

*Primary Examiner* — Dean O Takaoka
(74) *Attorney, Agent, or Firm* — Chen Yoshimura LLP

(57) ABSTRACT

An acoustic wave device includes: a first piezoelectric substrate; a first IDT that includes a plurality of first electrode fingers and is located on a first surface of the first piezoelectric substrate; a second piezoelectric substrate that is located above the first surface; and a second IDT that is located on a second surface of the second piezoelectric substrate, and includes a plurality of second electrode fingers that are non-parallel to the plurality of first electrode fingers, the second surface of the second piezoelectric substrate facing the first surface across an air gap.

11 Claims, 12 Drawing Sheets

(56) References Cited

U.S. PATENT DOCUMENTS

| | | | |
|---|---|---|---|
| 8,610,518 B1* | 12/2013 | Solal | H03H 9/0066 |
| | | | 310/313 B |
| 2007/0115079 A1 | 5/2007 | Kubo et al. | |
| 2009/0224851 A1 | 9/2009 | Feiertag et al. | |
| 2013/0099875 A1* | 4/2013 | Shimizu | H03H 9/25 |
| | | | 333/133 |
| 2013/0127566 A1* | 5/2013 | Iwaki | H03H 9/14594 |
| | | | 333/133 |
| 2015/0123744 A1* | 5/2015 | Nishimura | H03H 9/059 |
| | | | 333/133 |

* cited by examiner

ACOUSTIC WAVE DEVICE

CROSS-REFERENCE TO RELATED APPLICATION

This application is based upon and claims the benefit of priority of the prior Japanese Patent Application No. 2016-076882, filed on Apr. 6, 2016, the entire contents of which are incorporated herein by reference.

FIELD

A certain aspect of the present invention relates to an acoustic wave device.

BACKGROUND

As a packaging method of an acoustic wave device, there has been known a method that face-down mounts a chip on a circuit board, and then covers the periphery of the chip by a sealing member. The integration and downsizing of the acoustic wave device have been desired. Japanese Patent Application Publication No. 2008-546207 (Patent Document 1) describes that two piezoelectric substrates each including an Interdigital Transducer (IDT) formed on the surface thereof are bonded together so that the IDTs face each other across an air gap.

When the piezoelectric substrates are stacked so that the IDTs face each other as disclosed in Patent Document 1, a parasitic capacitance between the IDTs and/or wiring lines becomes large. Accordingly, the IDTs and/or the wiring lines interfere with each other, and the characteristics of the acoustic wave device deteriorate.

SUMMARY OF THE INVENTION

According to an aspect of the present invention, there is provided an acoustic wave device including: a first piezoelectric substrate; a first IDT that includes a plurality of first electrode fingers and is located on a first surface of the first piezoelectric substrate; a second piezoelectric substrate that is located above the first surface; and a second IDT that is located on a second surface of the second piezoelectric substrate, and includes a plurality of second electrode fingers that are non-parallel to the plurality of first electrode fingers, the second surface of the second piezoelectric substrate facing the first surface across an air gap.

DETAILED DESCRIPTION

Hereinafter, a description will be given of embodiments of the present invention with reference to the accompanying drawings.

First Embodiment

Figure 1:
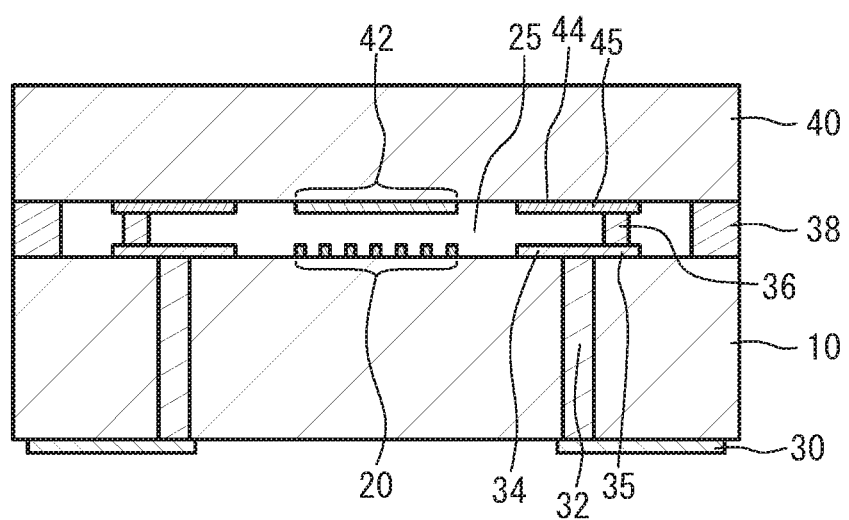
FIG. 1 is a cross-sectional view of an acoustic wave device in accordance with a first embodiment.

FIG. 1 is a cross-sectional view of an acoustic wave device in accordance with a first embodiment. As illustrated in FIG. 1, an acoustic wave resonator 20 is located on the upper surface of a piezoelectric substrate 10. Terminals 30 are located on the lower surface of the piezoelectric substrate 10 on which wiring lines 34 and pads 35 are located. The terminals 30 are, for example, foot pads. Via wirings 32 penetrating through the piezoelectric substrate 10 are formed. The via wiring 32 electrically connects the terminal 30 and the pad 35. An acoustic wave resonator 42, wiring lines 44, and pads 45 are located on the lower surface of a piezoelectric substrate 40. Bumps 36 and a ring-shaped sealing portion 38 are located between the piezoelectric substrates 10 and 40. The bump 36 electrically connects the pads 35 and 45. The ring-shaped sealing portion 38 is formed so as to surround the acoustic wave resonators 20 and 42, and seals the acoustic wave resonators 20 and 42 in an air gap 25. The acoustic wave resonators 20 and 42 face each other across the air gap 25.

The piezoelectric substrates 10 and 40 are, for example, a lithium tantalate substrate or a lithium niobate substrate. The terminals 30, the via wirings 32, and the pads 35 and 45 are formed of, for example, a metal layer such as a copper layer, an aluminum layer, or a gold layer. The bumps 36 are, for example, gold bumps, copper bumps, or solder bumps. The ring-shaped sealing portion 38 is formed of a metal layer such as a gold layer, a copper layer, or a solder layer, or an insulating layer such as a resin layer.

Figure 2A:
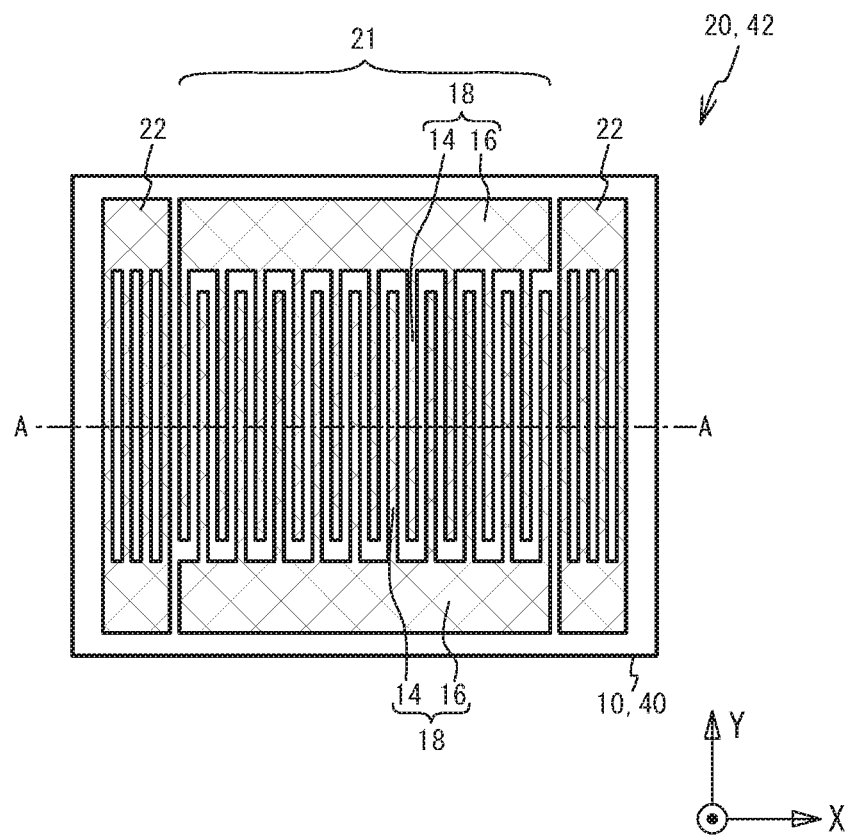
FIG. 2A is a plan view of the acoustic wave resonator in the first embodiment.
Figure 2B:
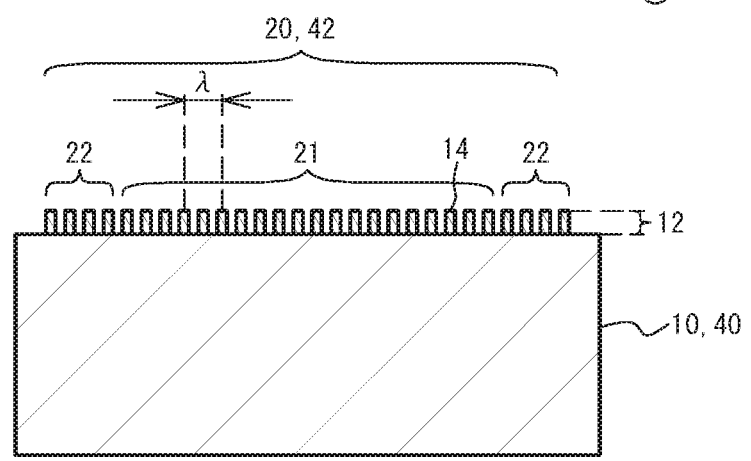
FIG. 2B is a cross-sectional view taken along line A-A in FIG. 2A.

FIG. 2A is a plan view of the acoustic wave resonator in the first embodiment, and FIG. 2B is a cross-sectional view taken along line A-A in FIG. 2A. As illustrated in FIG. 2A and FIG. 2B, an IDT 21 and reflectors 22 are formed on the piezoelectric substrate 10 or 40. The IDT 21 and the reflectors 22 are formed of a metal film 12 formed on the piezoelectric substrate 10 or 40. The IDT 21 includes a pair of comb-shaped electrodes 18 facing each other. The comb-shaped electrode 18 includes electrode fingers 14 and a bus bar 16 to which the electrode fingers 14 are connected. The pair of comb-shaped electrodes 18 are located so as to face each other so that the electrode fingers 14 of one of the comb-shaped electrodes 18 and the electrode fingers 14 of the other are arranged substantially in an alternate order.

An acoustic wave excited by the electrode fingers 14 mainly propagates in the alignment direction of the electrode fingers 14. The pitch of the electrode fingers 14 is approximately equal to the wavelength λ of the acoustic wave. The propagation direction of the acoustic wave is defined as an X direction, and a direction perpendicular to the propagation direction is defined as a Y direction (i.e., the extension direction of the electrode fingers 14). The X direction and the Y direction do not always correspond to the X-axis direction and the Y-axis direction of the crystal orientation of the piezoelectric substrate 10, respectively. When the piezoelectric substrate 10 or 40 is a rotated Y-cut X-propagation lithium tantalate substrate or a lithium niobate substrate, the X direction corresponds to the X-axis direction of the crystal orientation. The metal film 12 is, for example, an aluminum film or a copper film. When the aperture length across which the electrode fingers 14 of the pair of comb-shaped electrodes 18 overlap is increased, the resistance of the electrode fingers 14 increases. Thus, the length of the IDT 21 is made to be short in the Y direction, and to be long in the X direction. In addition, the reflectors 22 are located at both sides of the IDT 21 in the X direction. Accordingly, the acoustic wave resonators 20 and 42 are rectangles of which the side extending in the X direction in plan view is a longer side and of which the side extending in the Y direction is a shorter side.

Figure 3:
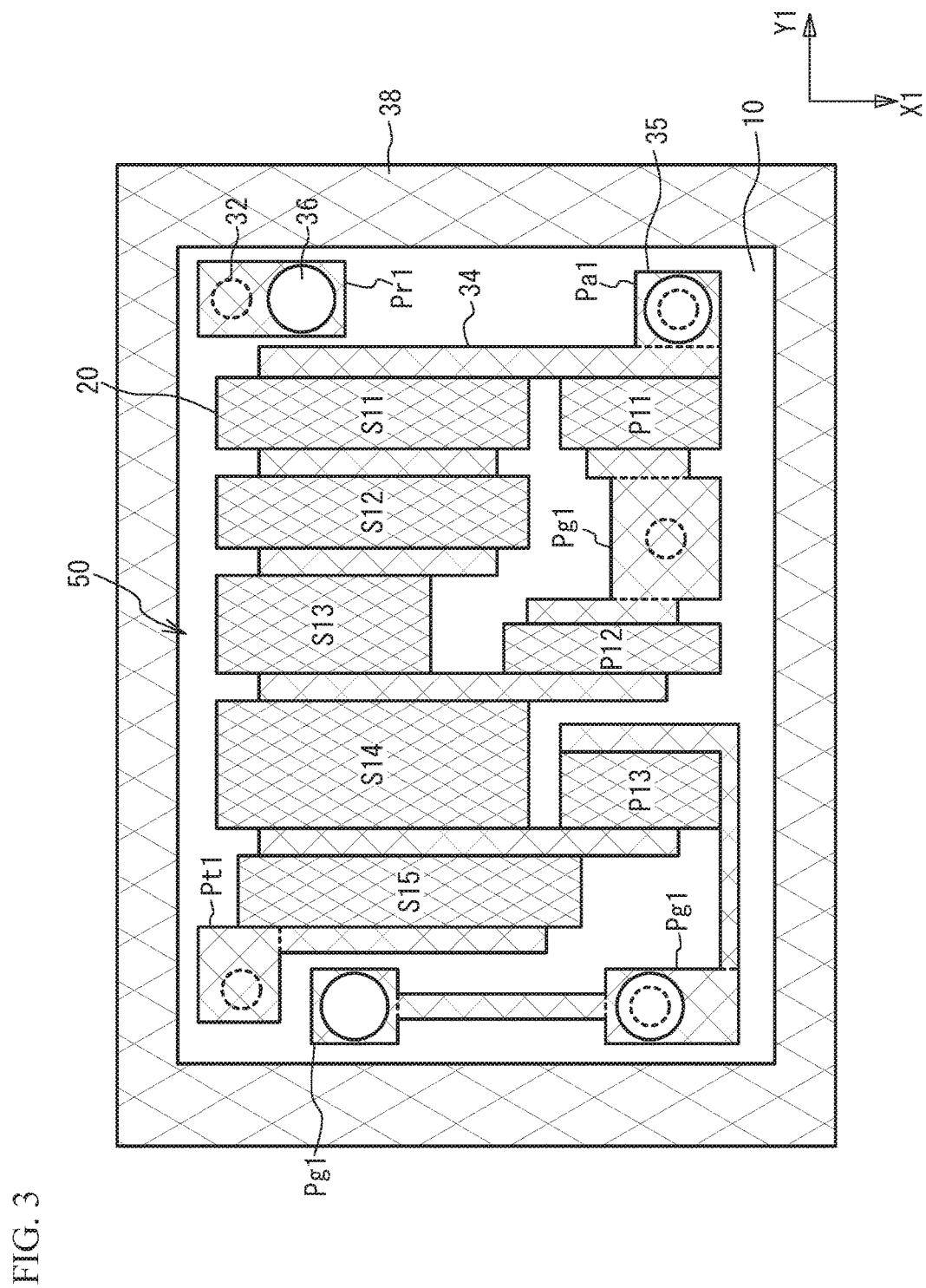
FIG. 3 is a plan view of the upper surface of a piezoelectric substrate 10 in the first embodiment.

FIG. 3 is a plan view of the upper surface of the piezoelectric substrate 10 in the first embodiment. As illustrated in FIG. 3, the ring-shaped sealing portion 38 is located in the outer periphery of the piezoelectric substrate 10. The acoustic wave resonators 20 are located on the upper surface of the piezoelectric substrate 10. The propagation direction of an acoustic wave excited by the acoustic wave resonator 20 (the alignment direction of the electrode fingers) is defined as an X1 direction, and the extension direction of the electrode fingers of the acoustic wave resonator 20 is defined as a Y1 direction. The acoustic wave resonator 20 has a rectangular shape in which the side extending in the X1 direction forms a longer side and the side extending in the Y1 direction forms a shorter side. The acoustic wave resonators 20 are electrically interconnected by the wiring lines 34. The acoustic wave resonator 20 and the pad 35 are electrically connected by the wiring line 34. The bump 36 is located on the pad 35, and the via wiring 32 is located under the pad 35.

Provided as the pads 35 are a common pad Pa1, a transmit pad Pt1, a receive pad Pr1, and ground pads Pg1. A plurality of series resonators S11 through S15 are connected in series between the common pad Pa1 and the transmit pad Pt1 through the wiring lines 34, and one or more parallel resonators P11 through P13 are connected in parallel between the common pad Pa1 and the transmit pad Pt1 through the wiring lines 34. As described above, a transmit filter 50, which is a ladder-type filter, is located on the upper surface of the piezoelectric substrate 10. The receive pad Pr1 is not electrically connected to the acoustic wave resonator 20 on the upper surface of the piezoelectric substrate 10.

Figure 4:
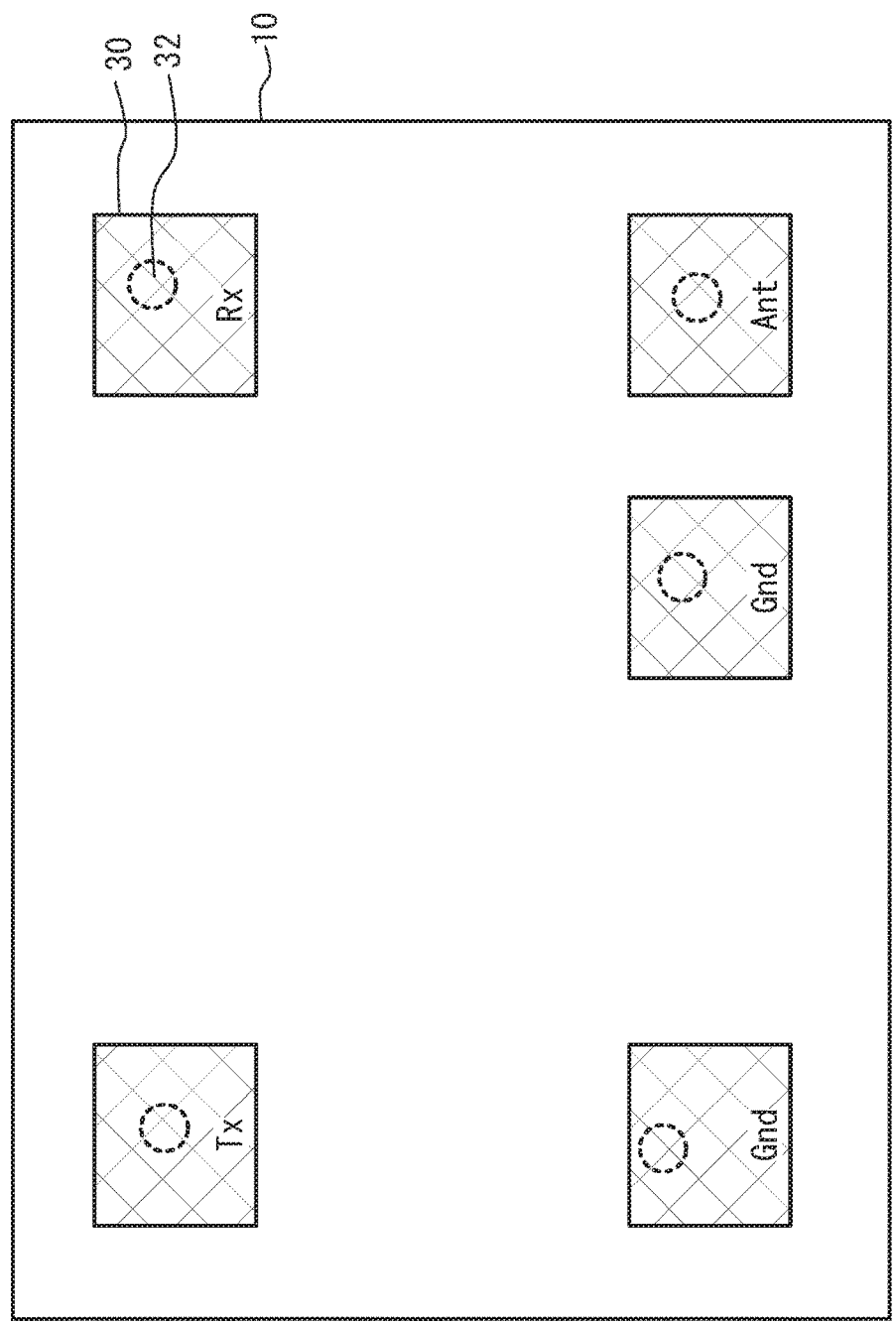
FIG. 4 is a plan view of the lower surface of the piezoelectric substrate 10 in the first embodiment.

FIG. 4 is a plan view of the lower surface of the piezoelectric substrate 10 in the first embodiment. For easy understanding, FIG. 4 is a plan view transparently illustrated from the upper surface of the piezoelectric substrate 10. As illustrated in FIG. 4, the terminals 30 are located on the lower surface of the piezoelectric substrate 10. Provided as the terminals 30 are a common terminal Ant, a transmit terminal Tx, a receive terminal Rx, and ground terminals Gnd. The common terminal Ant, the transmit terminal Tx, the receive terminal Rx, and the ground terminals Gnd are respectively electrically connected to the common pad Pa1, the transmit pad Pt1, the receive pad Pr1, and the ground pads Pg1 in FIG. 3 through the via wirings 32.

Figure 5:
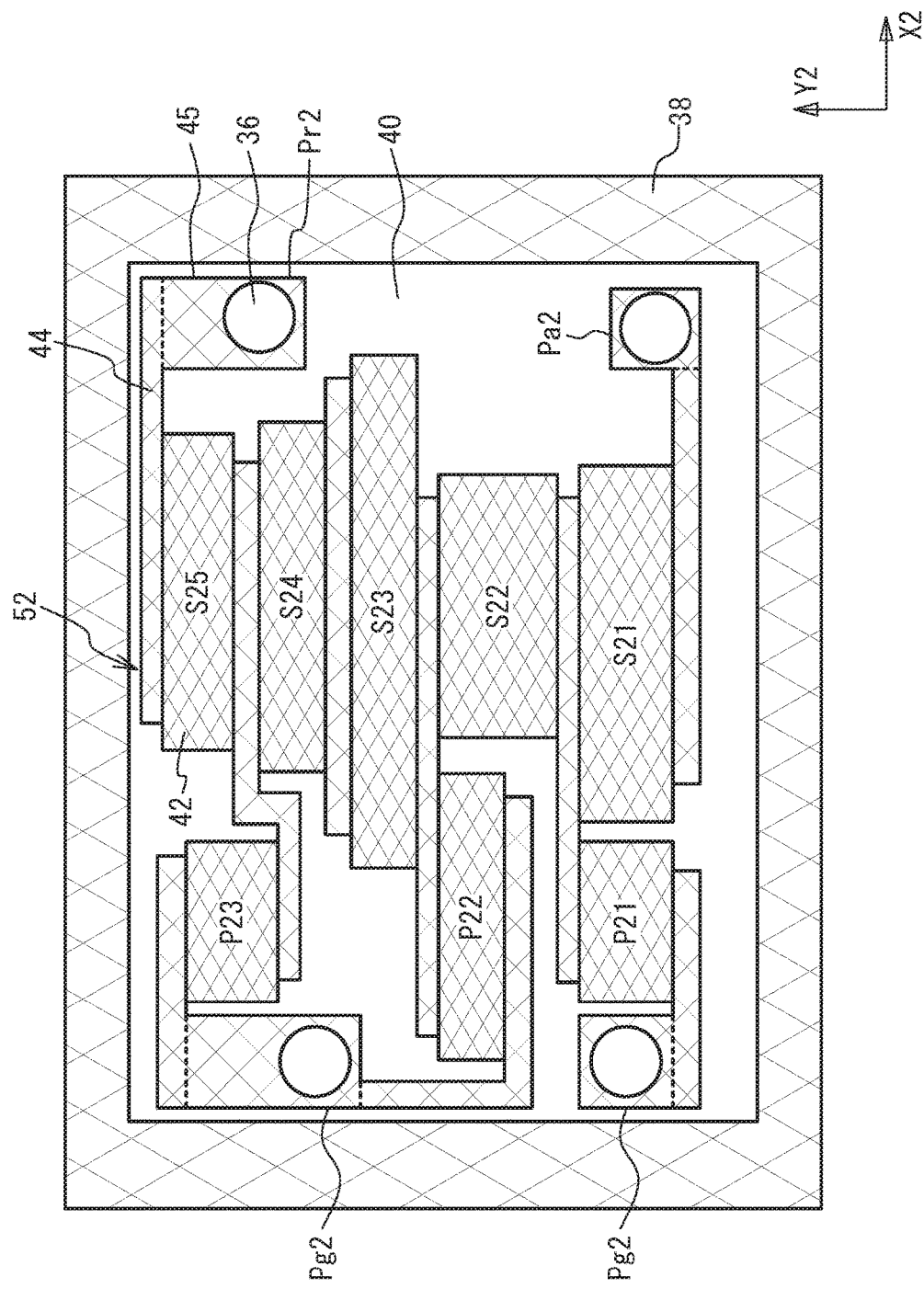
FIG. 5 is a plan view of the lower surface of a piezoelectric substrate 40 in the first embodiment.

FIG. 5 is a plan view of the lower surface of the piezoelectric substrate 40 in the first embodiment. For easy understanding, FIG. 5 is a plan view transparently illustrated from the upper surface of the piezoelectric substrate 40. As illustrated in FIG. 5, the ring-shaped sealing portion 38 is formed in the outer periphery of the piezoelectric substrate 40. The acoustic wave resonators 42 are located on the lower surface of the piezoelectric substrate 40. The propagation direction of an acoustic wave excited by the acoustic wave resonator 42 is defined as an X2 direction, and the extension direction of the electrode fingers in the acoustic wave resonator 42 is defined as a Y2 direction. The acoustic wave resonator 42 has a rectangular shape in which the side extending in the X2 direction forms a longer side and the side extending in the Y2 direction forms a shorter side. The acoustic wave resonators 42 are electrically interconnected by the wiring lines 44. The acoustic wave resonator 42 and the pad 45 are electrically connected by the wiring line 44.

The bumps 36 are located under the pads 45. Provided as the pads 45 are a common pad Pa2, a receive pad Pr2, and ground pads Pg2. A plurality of series resonators S21 through S25 are connected in series between the common pad Pa2 and the receive pad Pr2 through the wiring lines 44, and one or more parallel resonators P21 through P23 are connected in parallel between the common pad Pa2 and the receive pad Pr2 through the wiring lines 44. As described above, a receive filter 52, which is a ladder-type filter, is located on the lower surface of the piezoelectric substrate 40. The common pad Pa2, the receive pad Pr2, and the ground pads Pg2 are respectively electrically connected to the common terminal Ant, the receive terminal Rx, and the ground terminals Gnd through the common pad Pa1, the receive pad Pr1, and the ground pads Pg1 located on the upper surface of the piezoelectric substrate 10.

Figure 6:
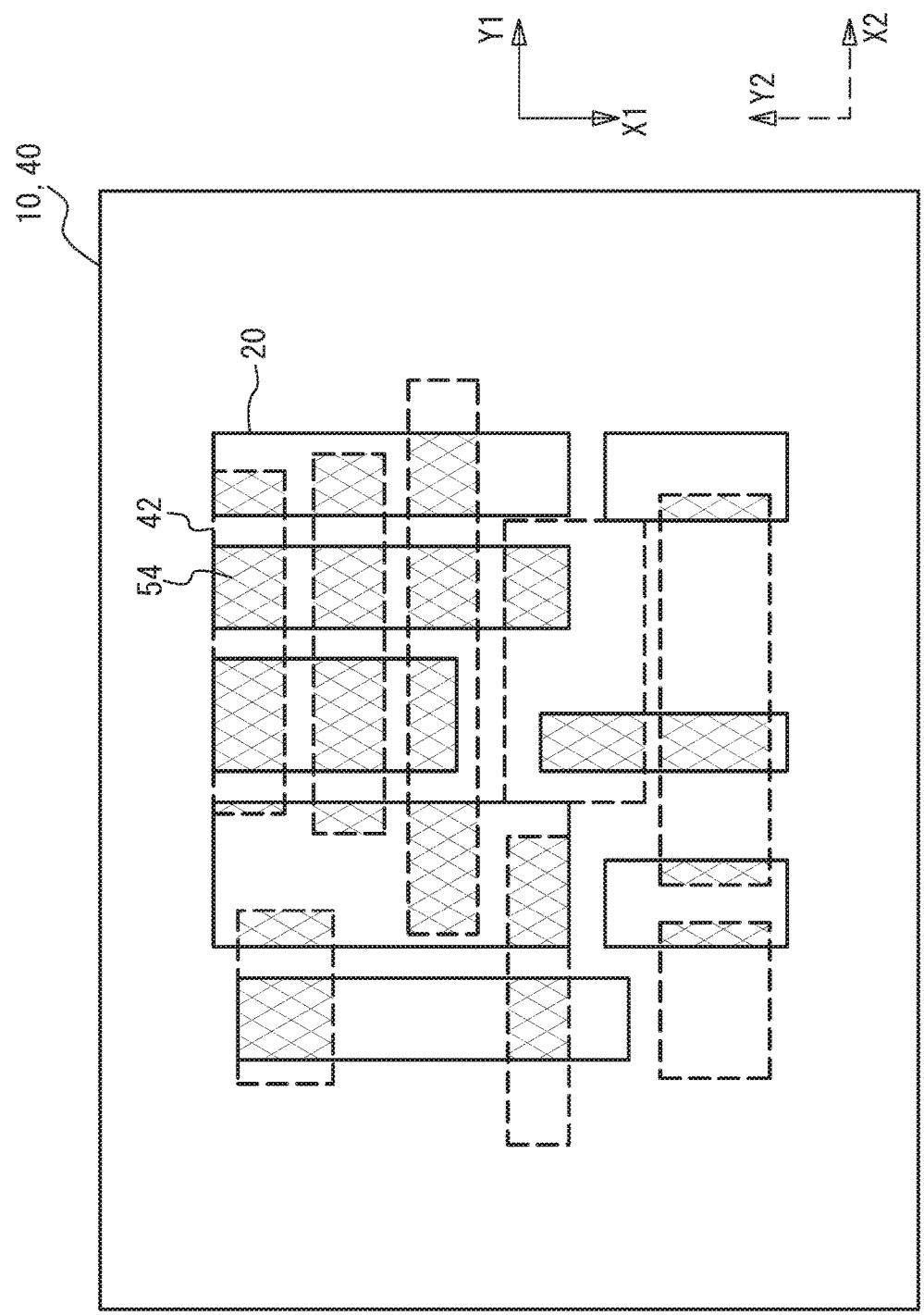
FIG. 6 illustrates overlapping acoustic wave resonators in plan view in the first embodiment.

FIG. 6 illustrates overlapping acoustic wave resonators in plan view in the first embodiment. In FIG. 6, the acoustic wave resonators 20 are indicated by solid lines, while the acoustic wave resonators 42 are indicated by dashed lines. A region 54 in which the acoustic wave resonators 20 and 42 overlap is indicated by cross-hatching. As illustrated in FIG. 6, the propagation direction X1 of the acoustic wave of the acoustic wave resonator 20 is substantially perpendicular to the propagation direction X2 of the acoustic wave of the acoustic wave resonator 42. The extension direction Y1 of the electrode fingers of the acoustic wave resonator 20 is substantially perpendicular to the extension direction Y2 of the electrode fingers of the acoustic wave resonator 42.

Figure 7:
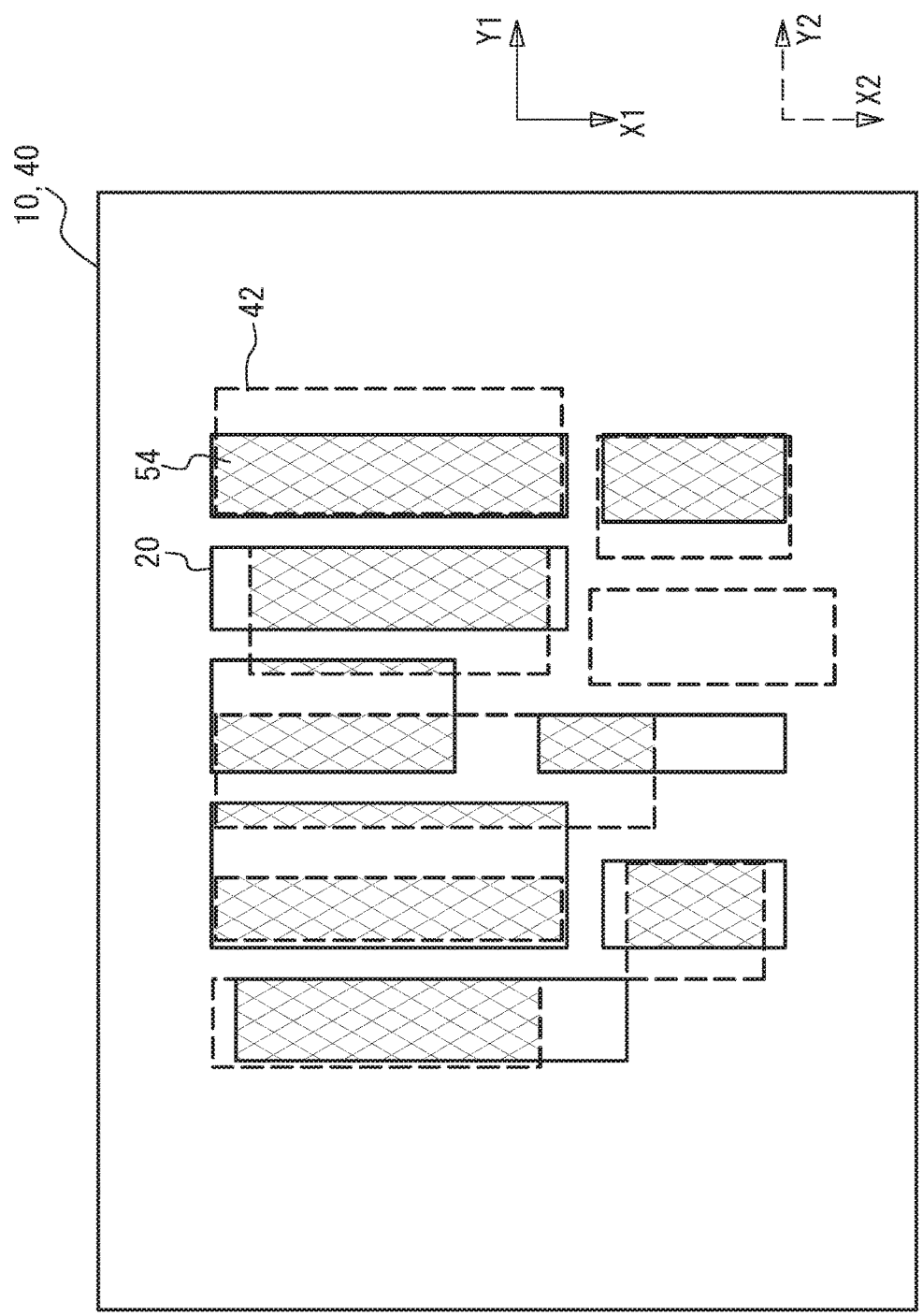
FIG. 7 illustrates overlapping acoustic wave resonators in plan view in a first comparative example.

FIG. 7 illustrates overlapping acoustic wave resonators in plan view in a first comparative example. As illustrated in FIG. 7, in the first comparative example, the propagation direction X1 of the acoustic wave of the acoustic wave resonator 20 is substantially parallel to the propagation direction X2 of the acoustic wave of the acoustic wave resonator 42. The extension direction Y1 of the electrode fingers of the acoustic wave resonator 20 is substantially parallel to the extension direction Y2 of the electrode fingers of the acoustic wave resonator 42. The arrangement of the acoustic wave resonators 20 are the same as that of the first embodiment. The acoustic wave resonators 42 having approximately the same area as those of the first embodiment are laid out so that the same arrangement as the first embodiment is achieved.

When FIG. 6 is compared with FIG. 7, the total area of the regions 54 in which the acoustic wave resonators 20 and 42 in the first embodiment overlap in plan view decreases by several tens of percent from that of the first comparative example. When the acoustic wave resonators 20 and 42 are made to face each other across the air gap 25, the distance between the acoustic wave resonators 20 and 42 corresponds to approximately the height of the bump 36, and is approximately 10 μm. When the total area of the regions 54 is large, the parasitic capacitance between the acoustic wave resonators 20 and 42 across the air gap 25 increases. Thus, a high-frequency signal propagating through the acoustic wave resonator 20 and a high-frequency signal propagating through the acoustic wave resonator 42 interfere with each other, and the isolation characteristic deteriorates. In the first embodiment, the total area of the regions 54 is less than that in the first comparative example, and the isolation characteristic improves. A description was given of the regions 54 in which the acoustic wave resonators 20 and 42 overlap, but the same discussion applies to the total area of the regions in which the wiring lines 34 and 44 overlap.

Figure 8A:
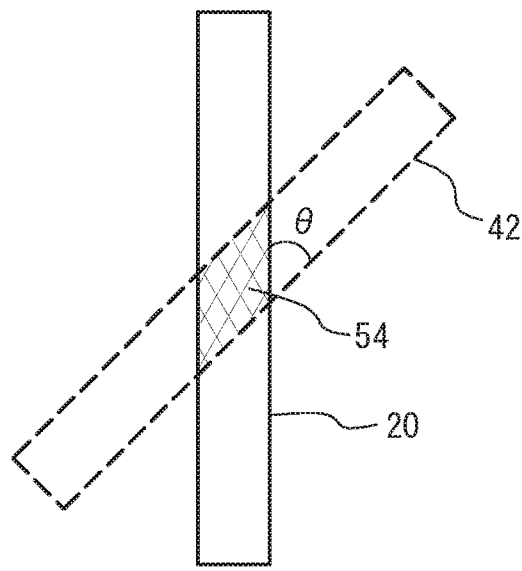
FIG. 8A illustrates acoustic wave resonators.
Figure 8B:
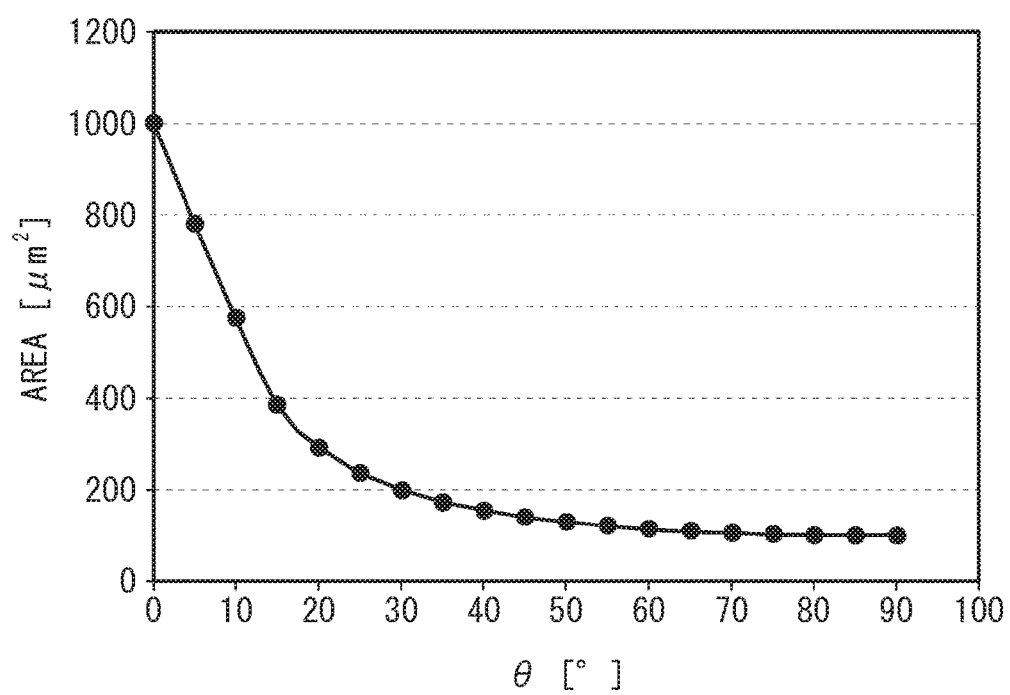
FIG. 8B is a graph of an overlap area versus an angle θ.

A description will be given of a case where the angle between the acoustic wave resonators 20 and 42 is not limited. FIG. 8A illustrates acoustic wave resonators, and FIG. 8B is a graph of an overlap region versus an angle θ. As illustrated in FIG. 8A, the areas of the acoustic wave resonators 20 and 42 were set to 10 μm×100 μm, and the area of the overlap region 54 was calculated by varying the angle θ between the acoustic wave resonators 20 and 42 in plan view. The area of the region 54 can be approximated by $1/\cos(90°-\theta)$.

As illustrated in FIG. 8B, the area of the region 54 rapidly decreases as the angle θ becomes greater than 0, and becomes constant at the angle θ of 30° or greater. When a plurality of the acoustic wave resonators 20 and a plurality of the acoustic wave resonators 42 are provided, it is not so simple as FIG. 8A, but the tendency of the relationship of the total area of the regions 54 to the angle θ is considered similar to the tendency illustrated in FIG. 8B.

When the distance between the acoustic wave resonators 20 and 42 is greater than the pitch of the electrode fingers 14, not the overlap of each of the electrode fingers 14 but the overlap of the acoustic wave resonators 20 and 42 as a whole mainly affects the parasitic capacitance. Thus, the total area of the regions 54 in which the acoustic wave resonators 20 and 42 overlap is proportional to the parasitic capacitance between the acoustic wave resonators 20 and 42. When the distance between the acoustic wave resonators 20 and 42 is less than the pitch of the electrode fingers 14, the overlap of each of the electrode fingers 14 also affects the parasitic capacitance. The calculation of the parasitic capacitance in this case becomes more complicated, but to reduce the area of the region in which the electrode fingers 14 of the acoustic wave resonators 20 and 42 overlap, the electrode fingers 14 of the acoustic wave resonator 20 are preferably not parallel to the electrode fingers 14 of the acoustic wave resonator 42.

Figure 9:
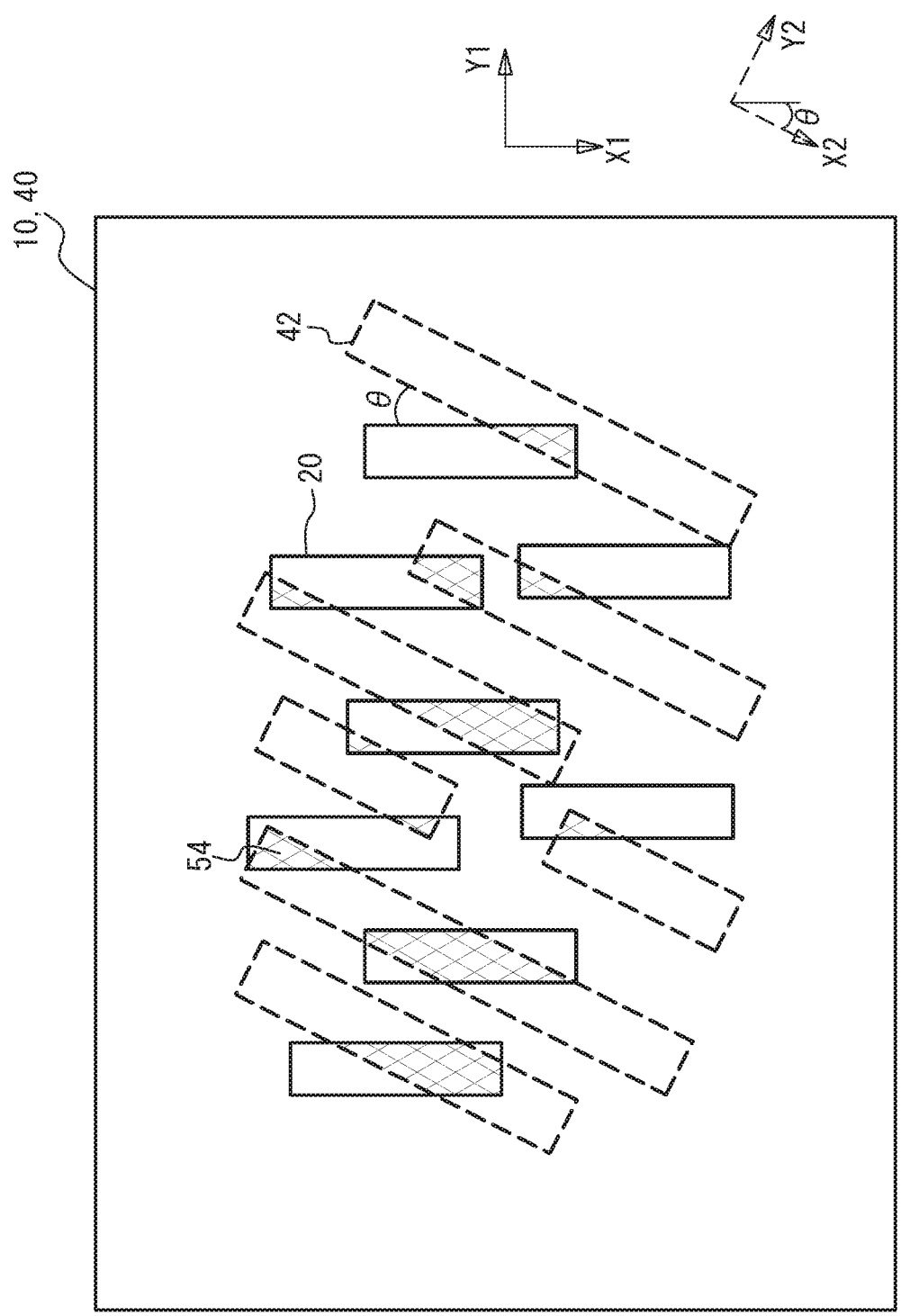
FIG. 9 illustrates overlapping acoustic wave resonators in plan view in a first variation of the first embodiment.

FIG. 9 illustrates overlapping acoustic wave resonators in accordance with a first variation of the first embodiment in plan view. As illustrated in FIG. 9, the angle between the propagation direction X1 of the acoustic wave of the acoustic wave resonator 20 and the propagation direction X2 of the acoustic wave of the acoustic wave resonator 42 is approximately 30°. The angle between the extension direction Y1 of the electrode fingers of the acoustic wave resonator 20 and the extension direction Y2 of the electrode fingers of the acoustic wave resonator 42 is approximately 30°. As in the first variation of the first embodiment, the directions X1 and X2 (i.e., the directions Y1 and Y2) may be inclined.

As in the first embodiment and the variation thereof, as illustrated in FIG. 1, the acoustic wave resonator 20 (a first IDT) is located on the upper surface (a first surface) of the piezoelectric substrate 10 (a first piezoelectric substrate). The acoustic wave resonator 42 (a second IDT) is located on the lower surface (a second surface) of the piezoelectric substrate 40 (a second piezoelectric substrate). The upper surface of the piezoelectric substrate 10 and the lower surface of the piezoelectric substrate 40 face each other across the air gap 25. As illustrated in FIG. 7 and FIG. 9, the extension direction Y1 of the electrode fingers of the acoustic wave resonator 20 and the extension direction Y2 of the electrode fingers of the acoustic wave resonator 42 are non-parallel. This structure can reduce the area of the region in which the acoustic wave resonators 20 and 42 overlap and/or the area of the region in which the wiring lines 34 and 44 overlap. Therefore, the parasitic capacitance between the acoustic wave resonators 20 and 42 is reduced, and the isolation characteristic improves.

In addition, as illustrated in FIG. 8B, to reduce the total area of the regions 54, the angle θ between the electrode fingers of the acoustic wave resonators 20 and 42 is preferably 30° or greater and 150° or less, more preferably 60° or greater and 120° or less. Furthermore, the angle θ between the electrode fingers of the acoustic wave resonators 20 and 42 is preferably approximately 90°. "Approximately 90°" is within a range that permits the variability in the fabrication process, and is, for example, 80° or greater and 100° or less, or 89° or greater and 91° or less.

Furthermore, when the distance between the acoustic wave resonators 20 and 42 is short, the parasitic capacitance between the acoustic wave resonators 20 and 42 increases. Therefore, when the distance between the acoustic wave resonators 20 and 42 is less than at least one of the thickness of the piezoelectric substrate 10 and the thickness of the piezoelectric substrate 40, the electrode fingers of the acoustic wave resonator 20 and the electrode fingers of the acoustic wave resonator 42 are preferably made to be non-parallel. The distance between the acoustic wave resonators 20 and 42 is preferably, for example, 30 μm or less.

Furthermore, the ring-shaped sealing portion 38 is formed so as to surround the acoustic wave resonators 20 and 42, and seals the acoustic wave resonators 20 and 42 in the air gap 25. In such a structure, the distance between the acoustic wave resonators 20 and 42 across the air gap 25 becomes short. Thus, the electrode fingers of the acoustic wave resonator 20 and the electrode fingers of the acoustic wave resonator 42 are preferably made to be non-parallel.

Furthermore, as illustrated in FIG. 3, in the piezoelectric substrate 10, the series resonators S11 through S15 (a plurality of first IDTs) are aligned in the Y1 direction. As illustrated in FIG. 5, in the piezoelectric substrate 40, the series resonators S21 through S25 (a plurality of second IDTs) are aligned in the Y2 direction. When a plurality of resonators are aligned as described above, the resonators S11 through S15 (and S21 through S25) form a rectangular shape as a group. Thus, the rectangle described in FIG. 8A and FIG. 8B can be handled as a group of the resonators. Thus, by making the electrode fingers of the acoustic wave resonator 20 and the electrode fingers of the acoustic wave resonator 42 non-parallel, the area of a region in which a group of the resonators S11 through S15 located on the upper surface of the piezoelectric substrate 10 and a group of the resonators S21 through S25 located on the lower surface of the piezoelectric substrate 40 overlap can be reduced. Therefore, the parasitic capacitances between the resonators S11 through S15 and S21 through S25 can be reduced, and the isolation between them can be improved.

Furthermore, as illustrated in FIG. 3, the series resonators S11 through S15 are connected in series, and as illustrated in FIG. 5, the series resonators S21 through S25 are connected in series. In such a structure, a plurality of resonators and wiring lines interconnecting the plurality of resonators form a rectangular shape as a group. Thus, by making the electrode fingers of the acoustic wave resonator 20 and the electrode fingers of the acoustic wave resonator 42 non-parallel, a group of the resonators S11 through S15 and the wiring lines 34 interconnecting the resonators S11 through S15, which is located on the upper surface of the piezoelectric substrate 10, and a group of the resonators S21 through S25 and the wiring lines 44 connecting the resonators S21 through S25, which is located on the lower surface of the piezoelectric substrate 40, overlap can be reduced.

Furthermore, the transmit filter 50 is located on the piezoelectric substrate 10, and the receive filter 52 is located on the piezoelectric substrate 40. The transmit filter 50 is a ladder-type filter, and includes a plurality of the series resonators S11 through S15 (first series resonators) and the parallel resonators P11 through P13 (first parallel resonators). The receive filter 52 is a ladder-type filter, and includes a plurality of the series resonators S21 through S25 (second series resonators) and the parallel resonators P21 through P23 (second parallel resonators). When the series resonators of the ladder-type filter are intended to be efficiently laid out, the series resonators are aligned in the extension direction of the electrode fingers. At this time, the series resonators and the wiring lines connecting the series resonators form a rectangular shape as a group. Thus, as illustrated in FIG. 3, the electrode fingers of the acoustic wave resonator 20 and the electrode fingers of the acoustic wave resonator 42 are made to be non-parallel. This structure can reduce the area of the region in which the series resonators S11 through S15 and the wiring lines 34 interconnecting the series resonators S11 through S15, which are located on the upper surface of the piezoelectric substrate 10, and the series resonators S21 through S25 and the wiring lines 44 interconnecting the series resonators S21 through S25, which are located on the lower surface of the piezoelectric substrate 40, overlap. Therefore, the parasitic capacitance between the transmit filter 50 and the receive filter 52 can be reduced, and the isolation between them can be improved.

A duplexer including the transmit filter 50 connected between the common terminal Ant and the transmit terminal Tx and the receive filter 52 connected between the common terminal Ant and the receive terminal Rx has been described as an example. In the duplexer, the leak of transmission signals from the transmit terminal Tx to the receive terminal Rx is a problem. The first embodiment can improve the isolation characteristic from the transmit terminal Tx to the receive terminal Rx.

The transmit filter 50 and the receive filter 52 have been described as an example, but filters located on the substrate 10 and the substrate 40 may not necessarily be a transmit filter and a receive filter, and may be ladder-type filters each being connected between the input terminal and the output terminal. For example, the transmit band and the receive band of the Frequency Division Duplex (FDD) system do not overlap. Thus, when filters have different passbands (for example, when the center frequencies of the passbands differ or when the passbands do not overlap), the isolation characteristic between the filters is important. Therefore, the electrode fingers of the acoustic wave resonator 20 and the electrode fingers of the acoustic wave resonator 42 are preferably made to be non-parallel. In addition, the filter may be a multimode filter.

Second Embodiment

Figure 10:
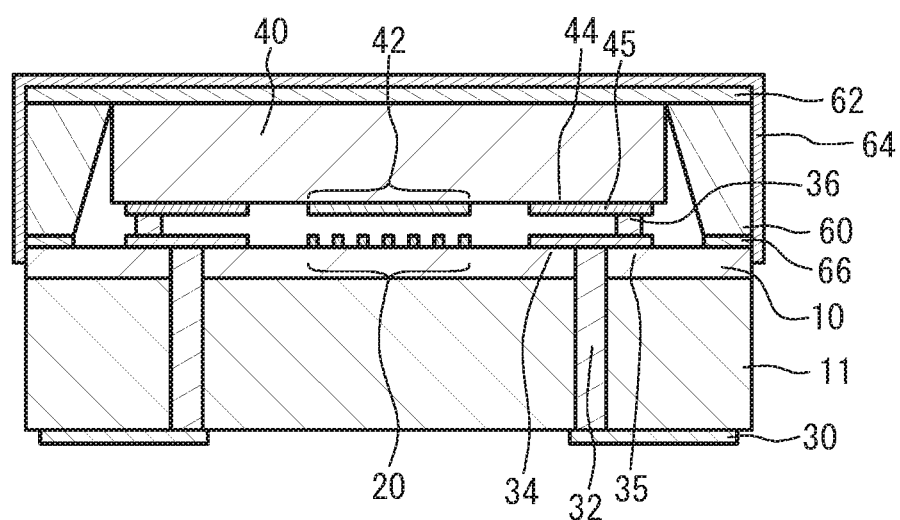
FIG. 10 is a cross-sectional view of an acoustic wave device in accordance with a second embodiment.

FIG. 10 is a cross-sectional view of an acoustic wave device in accordance with a second embodiment. As illustrated in FIG. 10, the piezoelectric substrate 10 is bonded on a support substrate 11. The via wirings 32 penetrate through the piezoelectric substrate 10 and the support substrate 11. A ring-shaped metal layer 66 is located on the upper surface of the piezoelectric substrate 10. A ring-shaped sealing portion 60 is located on the ring-shaped metal layer 66. The ring-shaped sealing portion 60 surrounds the piezoelectric substrate 40. A flat plate-like lid 62 is located on the upper surface of the piezoelectric substrate 40 and the upper surface of the ring-shaped sealing portion 60. A protective film 64 is formed so as to cover the lid 62 and the ring-shaped sealing portion 60. The support substrate 11 is, for example, a sapphire substrate, a spinel substrate, an alumina substrate, or a silicon substrate. The piezoelectric substrate 10 is, for example, a lithium niobate substrate or a lithium tantalate substrate. The ring-shaped sealing portion 60 is formed of, for example, a metal layer such as a solder layer or an insulating layer such as a resin layer. The ring-shaped metal layer 66 is a metal layer such as a nickel layer, a copper layer, an aluminum layer, or a gold layer. The lid 62 is, for example, a metal plate or an insulating plate. The protective film 64 is a metal film or an insulating film.

Figure 11:
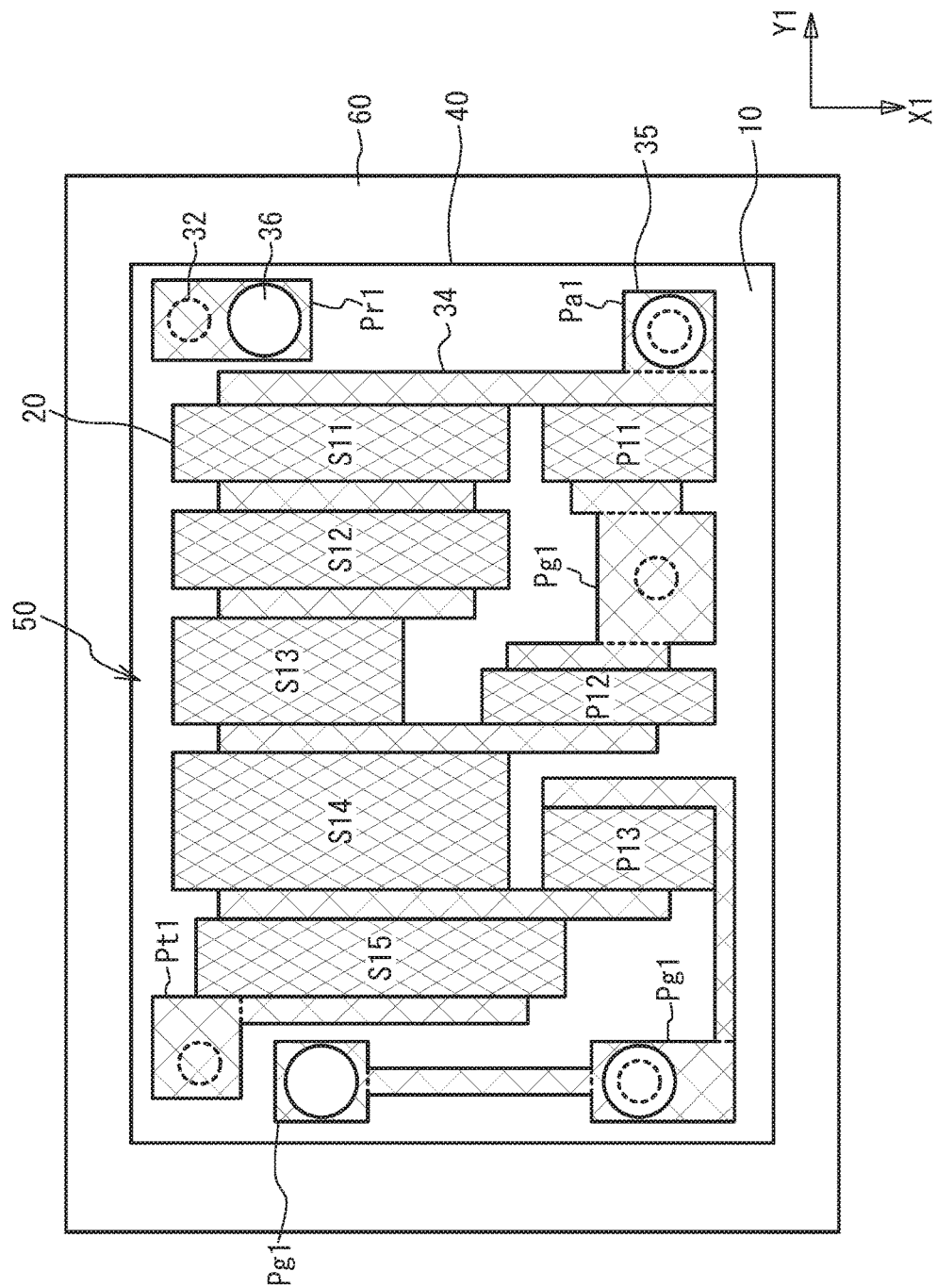
FIG. 11 is a plan view of the upper surface of the piezoelectric substrate 10 in the second embodiment.
Figure 12:
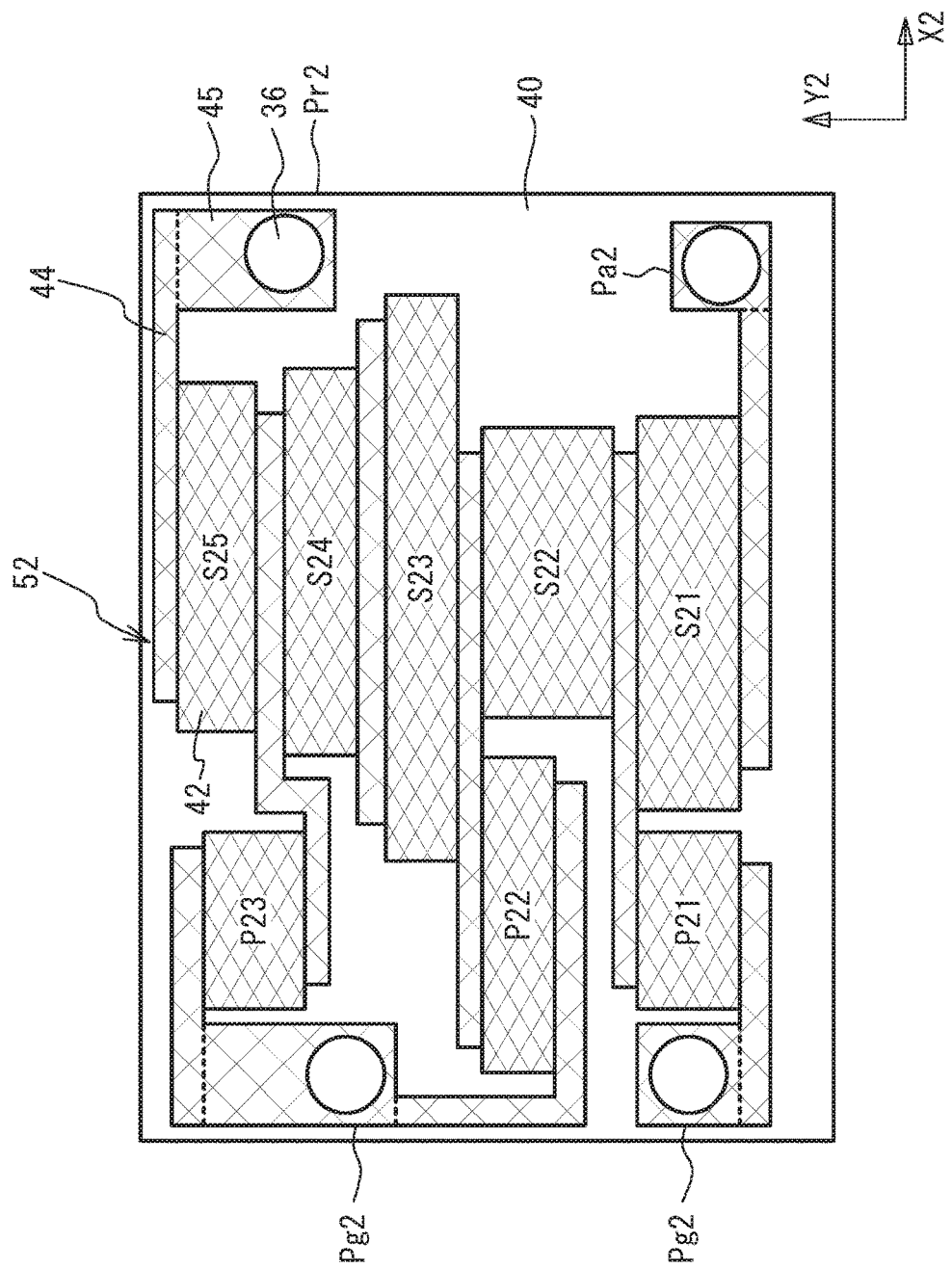
FIG. 12 is a plan view of the lower surface of the piezoelectric substrate 40 in the second embodiment.

FIG. 11 is a plan view of the upper surface of the piezoelectric substrate 10 in the second embodiment. FIG. 12 is a plan view of the lower surface of the piezoelectric substrate 40 in the second embodiment. In plan view, the piezoelectric substrate 40 is smaller than the piezoelectric substrate 10. The ring-shaped sealing portion 60 is formed so as to surround the piezoelectric substrate 40. Other structures are the same as those of the first embodiment, and the description thereof is thus omitted.

As illustrated in FIG. 10 through FIG. 12, the ring-shaped sealing portion 60 may be formed so as to surround the piezoelectric substrate 40. The piezoelectric substrate 10 may be bonded to the support substrate 11. The support substrate may be bonded on the piezoelectric substrate 40. Also in the first embodiment and the variation thereof, the piezoelectric substrate 10 and/or 40 may be bonded to a support substrate.

Alternatively, in the first and second embodiments and the variations thereof, a dielectric film may be formed on at least one of the upper surface of the piezoelectric substrate 10 and the lower surface of the piezoelectric substrate 40 so as to cover the IDT 21 and the reflectors 22.

Although the embodiments of the present invention have been described in detail, it is to be understood that the various change, substitutions, and alterations could be made hereto without departing from the spirit and scope of the invention.

What is claimed is:

1. An acoustic wave device comprising:
   a first piezoelectric substrate;
   a plurality of first IDTs that are located on a first surface of the first piezoelectric substrate, each of the plurality of first IDTs including a plurality of first electrode fingers;
   a second piezoelectric substrate that is located above the first surface; and
   a plurality of second IDTs that are located on a second surface of the second piezoelectric substrate, each of the plurality of second IDTs including a plurality of second electrode fingers, the second surface of the second piezoelectric substrate facing the first surface across an air gap,
   wherein:
   extension directions of the plurality of first electrodes of the plurality of first IDTs are parallel to each other and extend in a first extension direction;
   extension directions of the plurality of second electrodes of the plurality of second IDTs are parallel to each other and extend in a second extension direction; and
   the first extension direction is non-parallel to the second extension direction.

2. The acoustic wave device according to claim 1, wherein an angle between the first extension direction and the second extension direction in plan view is 30° or greater and 150° or less.

3. The acoustic wave device according to claim 1, wherein an angle between the first extension direction and the second extension direction in plan view is approximately 90°.

4. The acoustic wave device according to claim 1, wherein a distance between the plurality of first IDTs and the plurality of second IDTs is less than at least one of a thickness of the first piezoelectric substrate and a thickness of the second piezoelectric substrate.

5. The acoustic wave device according to claim 1, further comprising
a ring-shaped sealing portion that is formed so as to surround the plurality of first IDTs and the plurality of second IDTs, and seals the plurality of first IDTs and the plurality of second IDTs in the air gap.

6. The acoustic wave device according to claim 1, wherein:
the plurality of first IDTs are aligned in the first extension direction; and
the plurality of second IDTs are aligned in the second extension direction.

7. The acoustic wave device according to claim 6, wherein the plurality of the first IDTs are connected in series, and the plurality of the second IDTs are connected in series.

8. The acoustic wave device according to claim 6, further comprising:
a transmit filter that is located on the first piezoelectric substrate, and includes a plurality of first series resonators connected in series between a common terminal and a transmit terminal, and one or more first parallel resonators connected in parallel between the common terminal and the transmit terminal; and
a receive filter that is located on the second piezoelectric substrate, and includes a plurality of second series resonators connected in series between the common terminal and a receive terminal, and one or more second parallel resonators connected in parallel between the common terminal and the receive terminal, wherein
the plurality of first series resonators include the plurality of the first IDTs, respectively, and
the plurality of second series resonators include the plurality of the second IDTs, respectively.

9. The acoustic wave device according to claim 1, wherein:
each of the plurality of first IDTs includes a first bus bar to witch the plurality of first electrode fingers of a corresponding first IDT are connected;
each of the plurality of second IDTs includes a second bus bar to witch the plurality of second electrode fingers of s corresponding second IDT are connected;
extension directions of first bus bars of the plurality of first IDTs are parallel to each other and extend in a third extension direction;
extension directions of second bus bars of the plurality of second IDTs are parallel to each other and extend in a fourth extension direction; and
the third extension direction is non-parallel to the fourth extension direction.

10. The acoustic wave device according to claim 9, wherein:
the first extension direction is perpendicular to the third extension direction; and
the second extension direction is perpendicular to the fourth extension direction.

11. The acoustic wave device according to claim 1, wherein:
a part of the plurality of the first IDTs overlaps a part of the plurality of the second IDTs and remaining part of the plurality of the first IDTs does not overlaps the plurality of the second IDTs in plan view, and
a part of the plurality of the second IDTs overlaps a part of the plurality of the first IDTs, and remaining part of the plurality of the second IDTs does not overlaps the plurality of the first IDTs in plan view.

* * * * *